United States Patent
Cho

(10) Patent No.: US 7,642,118 B2
(45) Date of Patent: *Jan. 5, 2010

(54) IMAGE SENSOR FABRICATING METHOD

(75) Inventor: Eun Sang Cho, YongIn-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/002,097

(22) Filed: Dec. 14, 2007

(65) Prior Publication Data

US 2008/0160665 A1    Jul. 3, 2008

(30) Foreign Application Priority Data

Dec. 27, 2006  (KR) ............... 10-2006-0135749

(51) Int. Cl.
*H01L 21/00* (2006.01)
(52) U.S. Cl. ........... 438/69; 257/432; 257/E31.127
(58) Field of Classification Search ........ 438/48, 438/69; 257/436, 432, E31.127
See application file for complete search history.

(56) References Cited

U.S. PATENT DOCUMENTS

| 7,279,354 | B2 * | 10/2007 | Hwang ............... 438/70 |
| 2002/0058350 | A1 * | 5/2002 | Kim ............... 438/29 |
| 2006/0113622 | A1 * | 6/2006 | Adkisson et al. ....... 257/443 |
| 2006/0138498 | A1 * | 6/2006 | Kim ............... 257/294 |
| 2006/0292734 | A1 * | 12/2006 | Kim ............... 438/70 |

* cited by examiner

*Primary Examiner*—Zandra Smith
*Assistant Examiner*—Jamie Niesz
(74) *Attorney, Agent, or Firm*—The Law Offices of Andrew D. Fortney; Andrew D. Fortney

(57) ABSTRACT

A method of fabricating an image sensor includes forming a first $SiO_2$ layer on a color filter layer, patterning a photosensitive layer on first $SiO_2$ layer, patterning the first $SiO_2$ layer through a first etching process, forming a second $SiO_2$ layer on the first $SiO_2$ layer, and forming a micro-lens by etching the second $SiO_2$ layer.

18 Claims, 4 Drawing Sheets

IMAGE SENSOR FABRICATING METHOD

CROSS-REFERENCE TO RELATED APPLICATIONS

The present application claims priority under 35 U.S.C. 119 and 35 U.S.C. 365 to Korean Patent Application No. 10-2006-0135749 (filed on Dec. 27, 2006), which is hereby incorporated by reference in its entirety.

BACKGROUND

Embodiments of the invention relate to an image sensor and a method of fabricating the same.

Generally, in a complementary metal-oxide semiconductor (CMOS) image sensor, a micro-lens is formed on an uppermost layer. Light collected by the micro-lens passes through a color filter array layer and a planarization layer and is converted into an electric signal by a light reception unit such as a photodiode.

The image sensor displays an image using the converted electric signal. At this point, a focal-length of the micro-lens, a size and distribution of the color filter, a thickness of a Planarization layer, and a pitch size of the photodiode should be determined considering relative relations therebetween.

Meanwhile, the focal length of the micro-lens may vary greatly. Further, it is difficult to standardize the focal length of the micro-lens. That is, since a basic pattern is formed on a lens forming photosensitive layer through a defocus of a scanner, and the micro-lens is generally fabricated by performing a thermal reflow process on such a photosensitive layer, the focal length may vary greatly and the standardization of the focal length is difficult. Therefore, reproducibility of the micro-lens shape within certain manufacturing tolerances may be challenging.

SUMMARY

Embodiments of the present invention provide an image sensor fabricating method that can improve sensitivity by forming a zero-gap between adjacent lens elements.

An embodiment provides a method of fabricating an image sensor, the method including forming a first $SiO_2$ layer on a color filter layer, patterning a photosensitive layer on first $SiO_2$ layer, patterning the first $SiO_2$ layer by a first etching process, forming a second $SiO_2$ layer on the first $SiO_2$ layer, and etching the second $SiO_2$ layer to form a micro-lens.

Another embodiment provides a method of fabricating an image sensor, the method including forming a planarization layer on a color filter layer, forming a first $SiO_2$ layer on the planarization layer, patterning a photosensitive layer on the first $SiO_2$ layer, etching the resulting structure to pattern the first $SiO_2$ layer, forming a second $SiO_2$ layer on the first $SiO_2$ layer, and etching the second $SiO_2$ layer to form a micro-lens.

DETAILED DESCRIPTION OF THE EMBODIMENTS

In the description of the following embodiments, it will be understood that when a layer (or film) is referred to as being 'on/above' another layer or substrate, it can be directly on the other layer or substrate, or intervening layers may also be present. Further, it will be understood that when a layer is referred to as being 'under/below' another layer, it can be directly under the other layer, and one or more intervening layers may also be present. In addition, it will also be understood that when a layer is referred to as being 'between' two layers, it can be the only layer between the two layers, or one or more intervening layers may also be present.

Reference will now be made in detail to the embodiments of the present disclosure, examples of which are illustrated in the accompanying drawings.

FIGS. 1 through 4 are views illustrating conceptually an image sensor fabricating method according to embodiments of the present invention.

Figure 1:
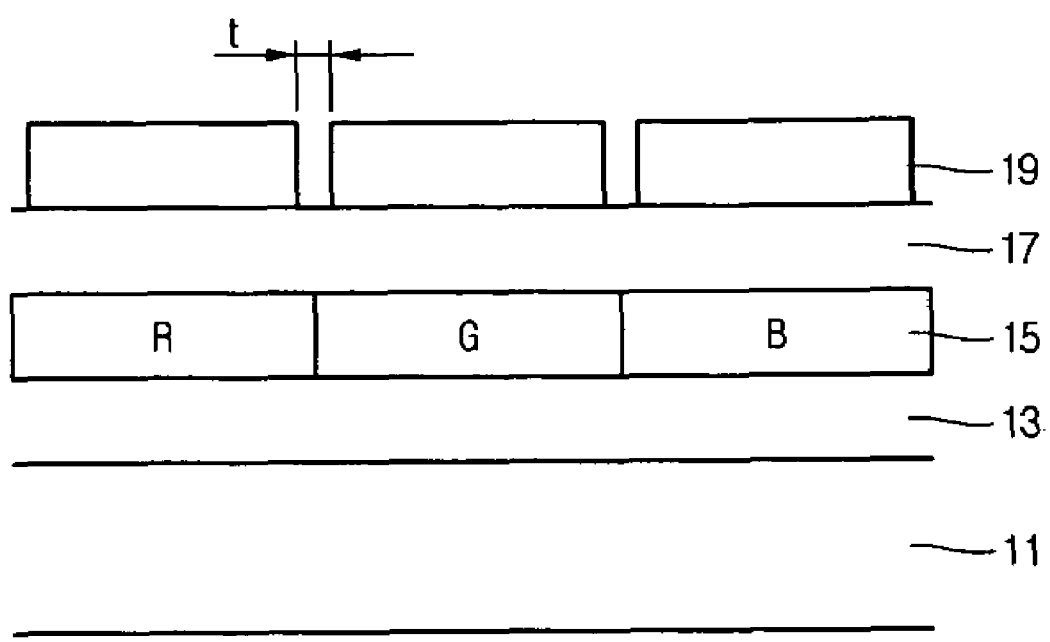
FIGS. 1 through 4 are views illustrating conceptually an image sensor fabricating method according to embodiments of the present invention.

As shown in FIG. 1, in an exemplary image sensor fabricating method of the present invention, a passivation layer 13 is first formed on an underlying structure 11, and a color filter layer 15 is formed on the passivation layer 13. The underlying structure 11 includes a light reception unit such as a photodiode and a metal line pattern. The color filter layer 15 may include red, green, and blue color filters. The color filters in the color filter layer 15 may have the same height. Before forming the color filter layer 15, a thermosetting resin layer may be formed under the color filter layer 15.

According to the exemplary image sensor fabricating method of the present invention, a first $SiO_2$ layer 17 is formed on the color filter layer 15 and a photosensitive layer 18 is formed on the first $SiO_2$ layer 17 and is processed (e.g., by photolithographic patterning and development) to form a predetermined pattern 19. The first $SiO_2$ layer 17 may be formed through a chemical vapor deposition (CVD) process or a low temperature oxide (LTO) deposition process, such as a plasma silane deposition process or a TEOS deposition process. Such a deposition process may be conducted at a temperature of $\leq 250°$ C., preferably $\leq 200°$ C. The first $SiO_2$ layer may comprise or be formed of a material having hardness greater than that of the photosensitive layer. At this point, the photosensitive layer 19 formed in the predetermined pattern 19 is formed such that a gap "t" between adjacent pixels is from 50 nm to about 300 nm, and in various embodiments, it may be about 100 nm or 200 nm (or any value within such a range).

Figure 2:
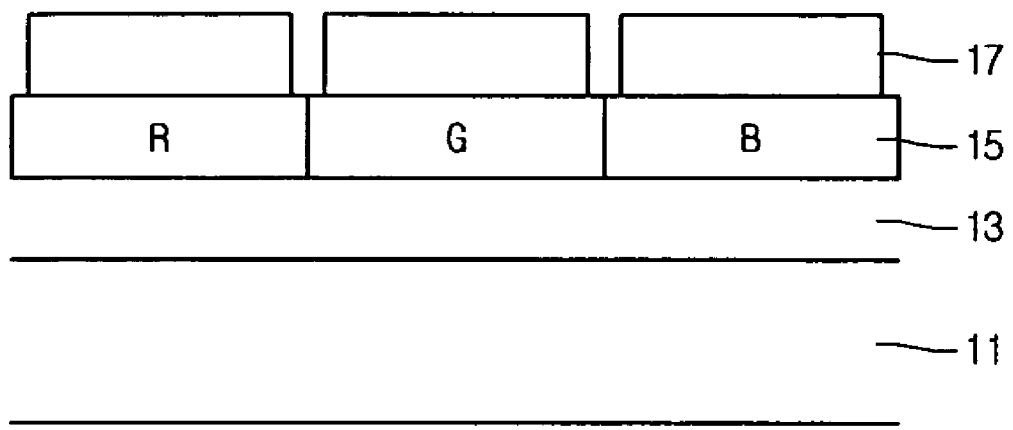

Further, as shown in FIG. 2, the patterned photosensitive layer 19 is processed through a first etching process to pattern the first $SiO_2$ layer 17. The first etching process may be performed by a reactive ion etching method, using a (hydro) fluorocarbon (e.g., $CF_4$, $CHF_3$, $C_2F_6$, $C_2HF_5$, $C_2H_2F_4$, $C_4F_8$, a combination thereof, etc.), a noble gas (e.g., He, Ne, Ar, Kr, etc.), and an oxygen source (e.g., $O_2$, $O_3$, $H_2O_2$, etc.). Etching conditions of the first etching process may include supplying the (hydro)fluorocarbon (e.g., $CF_4$), noble gas (e.g., Ar), and oxygen source (e.g., $O_2$) in a (flow rate) ratio of about 16:32:1. At this point, a supply rate of $CF_4$ may be about 70-90 sccm, a supply rate of Ar may be about 140-180 sccm, and a supply rate of $O_2$ may be about 4-6 sccm.

For example, exemplary etching conditions of the first etching process may be as follows:

| | |
|---|---|
| Pressure [mT] | 60 |
| RF POWER [W] | 1400 |
| $CF_4$ [sccm] | 80 |
| Ar [sccm] | 160 |
| $O_2$ [sccm] | 5 |

Figure 3:
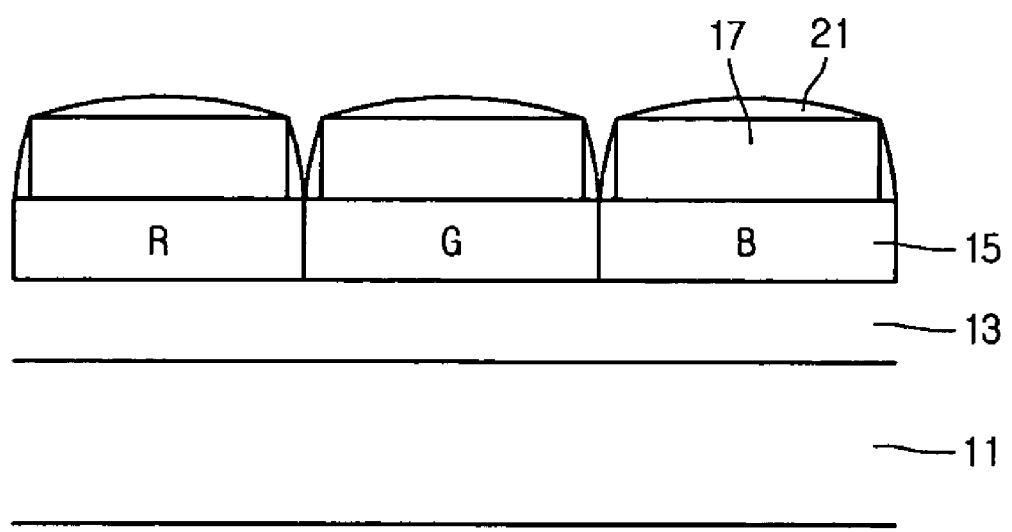

Next, as shown in FIG. 3, a second $SiO_2$ layer is formed on the patterned first $SiO_2$ layer. The second $SiO_2$ layer 21 may be formed by a chemical vapor deposition (CVD) process or a low temperature oxide (LTO) deposition process, as described above. The second $SiO_2$ layer 21 may comprise or be formed of a material having hardness greater than that of the photosensitive layer. The second $SiO_2$ layer 21 may comprise or be formed of a transparent material.

A thickness of the second $SiO_2$ layer 21 may be ½ or less of a gap between the adjacent pixels of the patterned photosensitive layer 19. For example, the thickness of the second $SiO_2$ layer 21 may be from 20 nm to about 150 nm, and in some implementations, about 40-75 nm (e.g., 45-55 nm, or about 50 nm). In general, the greater the thickness of the second $SiO_2$ layer 21, the greater the degree of rounding of the combined $SiO_2$ layers 17 and 21.

Figure 4:
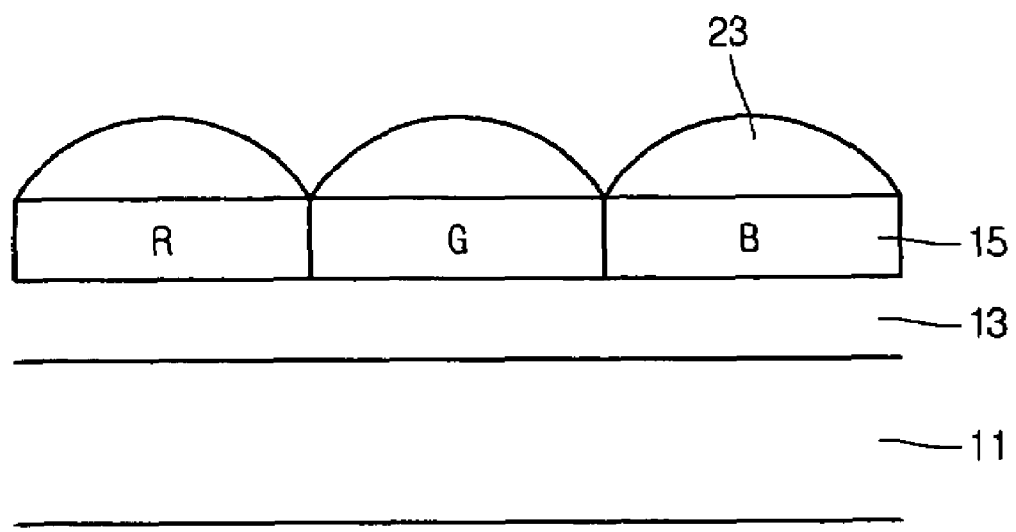

Next, as shown in FIG. 4, a second etching process is performed on the second $SiO_2$ layer 21 (and, when performed under conditions that etch a thickness of $SiO_2$ greater than the thickness of the second $SiO_2$ layer 21 at the corners of the first $SiO_2$ layer 17, a part of the first $SiO_2$ layer 17) to form the micro-lens 23. Generally, when the first $SiO_2$ layer 17 is etched, it is etched at or near the corners of the first $SiO_2$ layer 17.

According to the exemplary image sensor fabricating method, the second etching process for the second $SiO_2$ layer 21 may be a blanket-etching process and/or a reactive ion etching method, using a (hydro)fluorocarbon and an oxygen source as described above. Such etching may also be applied to the first $SiO_2$ layer 17.

Etching conditions of the second etching process may include supplying the (hydro)fluorocarbon (e.g., $CHF_3$) and the oxygen source (e.g., $O_2$) in a ratio of about 2:1. For example, a supply rate of $CHF_3$ may be about 40-60 sccm, and a supply rate of $O_2$ may be about 20-30 sccm.

For example, exemplary etching conditions of the second etching process may be as follows:

| | |
|---|---|
| Pressure [mT] | 55 |
| RF POWER [W] | 600 |
| $CHF_3$ [sccm] | 50 |
| $O_2$ [sccm] | 25 |

According to the exemplary image sensor fabricating method, the micro-lens 23 may have a convex-lens shape, and can comprise or be formed of a material forming the first and second $SiO_2$ layers (e.g., $SiO_2$). The micro-lenses 23 may have no gap between adjacent lens elements. The degree to which the "zero gap" can be formed in microlenses 23 is relatively reproducible in comparison with microlenses formed from photosensitive polymeric materials, because photolithography, deposition, and etching processes are generally more controllable (e.g., have less relative variation across process corners) than a thermal process such as the reflow process. However, even when there is a gap between oxide microlenses 23 in the present case, the gap can be made smaller and more reproducibly than in the case of photosensitive polymers.

As described above, according to embodiments of the present image sensor fabricating method, the microlens 23 can comprise or be formed of a material harder than photosensitive material (e.g., photoresist). Therefore, a phenomenon where particles (e.g., polymer particles) adhere to the micro-lens in a wafer back grinding process, a sawing process, and the like can be reduced or prevented. As a result, the sensitivity and production yield of the device can be improved. Further, improved reproducibility of the micro-lens can be obtained.

According to embodiments of the present image sensor fabricating method, a pad portion formed on the underlying structure 11 (not shown) may be opened first before the micro-lens 23 is formed. In this case, the photosensitive layer may be formed on the exposed pad in a subsequent process, thereby preventing the opened pad from being damaged.

Further, according to embodiments of the present image sensor fabricating process, the pad on the underlying structure 11 may be exposed by etching the passivation layer 13 after the micro-lens 23 is formed. For example, the pad portion may be exposed by etching the photosensitive layer on the micro-lens 23.

According to embodiments of the present image sensor fabricating process, the pad portion can be easily exposed through only one pad opening process. Further, since the pad opening process can be performed as a last process, a problem that the pad is corroded when the pad is exposed before the last process can be solved.

In the embodiment(s) shown in the Figures, the micro-lens is formed on the color filter layer. However, the present invention is not limited to this embodiment. For example, a planarization layer may be formed on the color filter layer, and the micro-lens may be formed on the planarization layer.

The image sensor fabricated by the above-described method includes forming the underlying structure 11, including forming the photodiode and/or the metal line pattern, and forming the passivation layer 11 on the underlying structure 11. The pad portion is formed on the underlying structure 11 and the pad portion functions as an external signal connector.

Further, the image sensor further includes the color filter layer 15 on the passivation layer 13 and the microlens 23 comprising the $SiO_2$ layer(s) on the color filter layer 15.

As described above, the microlens 23 can comprise or be formed of a material harder than a photosensitive material such as photoresist in the present image sensor. Therefore, a phenomenon where particles (e.g., polymer particles) adhere to the micro-lens in a wafer back grinding process, a sawing process, and the like can be reduced or prevented. As a result, the reproducibility of the micro-lens can be improved. Further, the sensitivity and production yield of the device can be improved.

According to the exemplary image sensor and method of fabricating the image sensor, adjacent microlenses may have a zero gap, thereby enhancing the sensitivity of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating an image sensor, the method comprising:
    forming a first $SiO_2$ layer on a color filter layer by a first low temperature oxide process;
    patterning a photosensitive layer on the first $SiO_2$ layer by photolithographic patterning and development;
    patterning the first $SiO_2$ layer by a first etching process;
    depositing a second $SiO_2$ layer on the first $SiO_2$ layer by a second low temperature oxide process to a thickness of from 20 to 150 nm; and
    forming micro-lenses by simultaneously reactive ion etching the first $SiO_2$ layer and the second $SiO_2$ layer using a (hydro)fluorocarbon and an oxygen source.

2. The method according to claim 1, wherein the first and second etching processes comprise reactive ion etching processes.

3. The method according to claim 1, wherein a hardness of the first $SiO_2$ layer is higher than that of the photosensitive layer.

4. The method according to claim 1, wherein forming the first and second $SiO_2$ layers each comprises a chemical vapor deposition process.

5. The method according to claim 1, wherein the second $SiO_2$ layer has a thickness that is half of a gap between adjacent pixels of the patterned photosensitive layer.

6. The method according to claim 1, wherein the first etching process comprises supplying a (hydro)fluorocarbon, a noble gas, and an oxygen source at a flow rate ratio of about 16:32:1.

7. The method according to claim 1, wherein the second etching process comprises supplying a (hydro)fluorocarbon and an oxygen source at a flow rate ratio of about 2:1.

8. The method according to claim 1, further comprising forming a light reception portion on a semiconductor substrate before forming the color filter layer.

9. The method according to claim 1, further comprising forming a thermosetting resin layer before forming the color filter layer.

10. The method according to claim 1, wherein the micro-lenses are gapless.

11. A method of fabricating an image sensor, the method comprising:
    forming a planarization layer on a color filter layer;
    forming a first $SiO_2$ layer on the planarization layer by a first low temperature oxide process;
    patterning a photosensitive layer on the first $SiO_2$ layer by photolithographic patterning and development;
    etching the exposed first $SiO_2$ layer;
    depositing a second $SiO_2$ layer on the first $SiO_2$ layer by a second low temperature oxide process to a thickness of from 20 to 150 nm; and
    forming a micro-lens by simultaneously reactive ion etching the first $SiO_2$ layer and the second $SiO_2$ layer using a (hydro)fluorocarbon and an oxygen source.

12. The method according to claim 11, wherein the first and second etching processes comprise reactive ion etching processes.

13. The method according to claim 11, wherein a hardness of the first $SiO_2$ layer is higher than that of the photosensitive layer.

14. The method according to claim 11, wherein forming the first and second $SiO_2$ layers each comprise a chemical vapor deposition process.

15. The method according to claim 11, wherein the second $SiO_2$ layer has a thickness that is half of a gap between adjacent pixels of the patterned photosensitive layer.

16. The method according to claim 11, wherein the first etching process comprises supplying a (hydro)fluorocarbon, a noble gas, and an oxygen source at a flow rate ratio of about 16:32:1.

17. The method according to claim 11, wherein the second etching process comprises supplying a (hydro)fluorocarbon and an oxygen source at a flow rate ratio of about 2:1.

18. The method according to claim 12, further comprising forming a thermosetting resin layer before forming the color filter layer.

* * * * *